United States Patent [19]

Dewees et al.

[11] 4,246,064
[45] Jan. 20, 1981

[54] DOUBLE CRUCIBLE CRYSTAL GROWING PROCESS

[75] Inventors: Thomas J. Dewees, Falls Township, Bucks County, Pa.; John S. Fangman; Wen Lin, both of Ewing Township, Mercer County, N.J.

[73] Assignee: Western Electric Company, Inc., New York, N.Y.

[21] Appl. No.: 54,124

[22] Filed: Jul. 2, 1979

Related U.S. Application Data

[62] Division of Ser. No. 944,454, Sep. 21, 1978, Pat. No. 4,190,631.

[51] Int. Cl.³ .............................................. C30B 15/12
[52] U.S. Cl. .............................. 156/608; 156/617 SP
[58] Field of Search .............................. 422/248, 249; 156/617 SP, 608, DIG. 83; 148/172

[56] References Cited

U.S. PATENT DOCUMENTS

| 2,892,739 | 6/1959 | Rusler | 148/1.5 |
|---|---|---|---|
| 2,944,875 | 7/1960 | Leverton | 422/249 |
| 3,025,191 | 3/1962 | Leverton | 148/1.6 |
| 3,305,485 | 2/1967 | Burmeister et al. | 156/617 |
| 3,637,439 | 1/1972 | DeBie | 148/1.6 |
| 4,036,595 | 7/1977 | Lorenzini | 422/249 |

FOREIGN PATENT DOCUMENTS

551638 1/1958 Canada .................................... 156/608

OTHER PUBLICATIONS

Solid-State Electronics, 1960 vol. 5, pp. 131-134, Valcic.
Journal of Applied Physics, vol. 29, No. 8, 8/58, pp. 1241-1244.

Primary Examiner—Hiram Bernstein
Attorney, Agent, or Firm—D. J. Kirk

[57] ABSTRACT

The disclosure is directed to a double crucible Czochralski crystal semiconductor growing apparatus (10). An inner crucible (14) floats in a melt within an outer crucible (13) and a single crystal semiconductor billet (23) is pulled from the melt (16) in the inner crucible. An elongated tubular member (26), having at least one small aperture (33) in the wall thereof, provides a channel between the outer and inner crucibles. The tubular member (26) permits flow of the melt in the outer crucible (14) to the inner crucible (13) while inhibiting the diffusion of dopant material from the inner to outer crucible while any gas in the member will pass through the aperture (33).

3 Claims, 10 Drawing Figures

4,246,064

DOUBLE CRUCIBLE CRYSTAL GROWING PROCESS

This is a division of application Ser. No. 944,454, filed Sept. 21, 1978 which issued as U.S. Pat. No. 4,190,631, on Feb. 26, 1980.

TECHNICAL FIELD

The invention is directed to a method of producing semiconductor single crystal material using the Czochralski process. In particular, axial dopant uniformity is achieved in the semiconductor material using first and second crucibles having an interconnecting channel to permit flow of semiconductor melt therebetween.

BACKGROUND OF THE INVENTION

It is well known to produce semiconductor single crystal material using the Czochralski technique by forming a melt of the crystal material and bringing a "seed crystal" into contact with the melt. The seed is then pulled slowly upwards, the molten material solidifying at the seed-melt interface, thus forming a single crystal billet.

Such a method has been found to be most effective however, the crystal produced suffers from non-uniform electrical resistivity along its length. This is primarily due to the fact that the doping agents (e.g., arsenic, antimony, gallium or indium) commonly added to the pure semiconductor material (e.g., silicon, germanium), are more soluble in the liquid semiconductor material. Hence, in a growing crystal, the concentration of doping agent in the solid semiconductor crystal is less than the concentration of doping agent in the adjacent liquid melt. Therefore, as a crystal billet is grown by the Czochralski process, a steadily increasing concentration of doping agent is left in the remaining melt resulting in an increase in resistivity along the length of the grown crystal billet.

Although such a crystal billet may be used in many applications where changes in resistivity are not critical, a number of devices, such as transistors, have parameters which vary more or less linearly with the resistivity of the semiconductor single crystal. The difficulty of making devices with predictable characteristics is greatly increased if uniform resistivity is not obtained during the crystal growing process.

A technique used to improve the axial resistivity uniformity of single crystal semiconductor billet is described in U.S. Pat. No. 2,944,875 which issued on July 12, 1960. That patent describes an apparatus in which the concentration of doping agent as well as the volume of the crystal melt is kept substantially constant throughout the seed-pulling process so that a single crystal billet of uniform resistivity may be grown. The apparatus comprises a pair of cylindrical crucibles the second of which is designed to fit loosely into the first and the second or inner crucible is provided with a small hole drilled through the bottom thereof. The crucibles are so arranged that a first charge of high purity undoped or lightly doped semiconductor material is placed in the outer crucible and a second charge of higly doped semiconductor material placed in the inner crucible. Heat is then applied to the double crucible arrangement to form a crystal melt in the inner and outer crucibles. Accordingly, the outer crucible contains a first melt of lightly doped or undoped semiconductor material and the inner crucible, floating within the first melt, holds a second melt of semiconductor material having a substantially greater concentration of dopant therein.

A single crystal billet may be grown from the inner crucible melt by the above-described seed-pulling method and, as the crystal grows, the lightly doped semiconductor material will flow from the outer crucible into the inner crucible, through the hole to maintain the floating inner crucible at an equilibrium level while diluting the dopant concentration of the melt therein. Therefore, until the inner crucible touches the bottom of the outer crucible, the volume of liquid semiconductor material in the inner crucible will remain constant. Since only a small fraction of the dopant agent is used up in the growing crystal billet, the dopant concentration level in the inner crucible melt remains substantially constant during the process which tends to result in the crystal having uniform resistivity along its length.

However, the single opening or hole in the inner floating crucible undesirably permits mechanical mixing of the melt in the two crucibles as well as back dopant diffusion (i.e., diffusion of dopant from the inner to the outer crucible) which alters the dopant concentrations in the inner and outer crucibles and results in non-uniform resistivity of the grown single crystal billet. In order to decrease any back diffusion or mechanical mixing of the inner crucible melt and the outer crucible melt, a narrow channel may be formed between the inner and outer crucibles as shown in an article titled "A Process for Obtaining Single Crystals with Uniform Solute Concentrations," by A. V. Valcic, in *Solid State Electronics*, 1960, pages 131 to 134.

However, as the solid semiconductor material is simultaneously melted in the crucibles, gas bubbles tend to be captured in such a narrow passageway. The captured bubbles stop the melt flow between the crucibles causing the concentration of the dopant in the inner crucible to rapidly increase requiring that the process be aborted or that the grown billet be used for fabrication of devices having less stringent resistivity standards.

SUMMARY OF THE INVENTION

The instant method overcomes the foregoing problem with a technique for growing a single crystal semiconductor billet from a melt in a first crucible, which melt is replenished by a melt in a second crucible via an elongated communicating channel. The material flows through the channel which has at least one aperture in the wall thereof to permit gas to pass while substantially precluding the flow of the melt therethrough.

DETAILED DESCRIPTION

The instant invention is described in a particular exemplary embodiment in which a floating double crucible arrangement is used to grow single crystal silicon billet. However, such an embodiment is for purposes of exposition and not for limitation. Various other embodiments are contemplated wherein first and second chambers containing melts are arranged so that the melt from one chamber must flow into the other chamber via a channel communicating therebetween.

Figure 1:
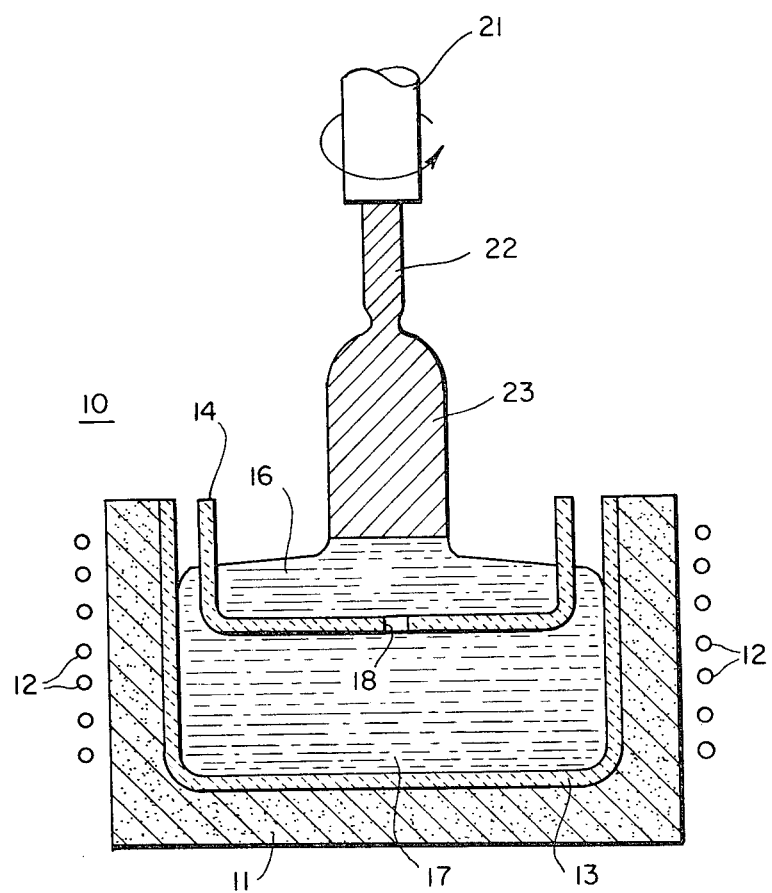
FIG. 1 is a partial cross-sectional view of a prior art crystal growing apparatus.

FIG. 1 depicts a prior art floating double crucible Czochralski (Cz) semiconductor crystal growing apparatus, generally indicated by the numeral 10. The crystal growing appartus 10 is comprised of housing 11 (e.g., graphite) surrounded by a series of high frequency induction coils 12—12. An outer crucible 13 is seated within the housing 11 and an inner crucible 14 is shown floating in a melt (e.g., germanium silicon). The first melt 16 within the inner crucible 14 has a first dopant concentration level and the second melt 17 has a second dopant concentration level which is lower than the first concentration level. An opening 18 in the bottom of the inner crucible 14 permits flow of the second melt 17 into the inner crucible 14.

In operation, a rotating pull rod 21 holding a single crystal semiconductor seed 22 causes the seed to contact the surface of the first melt 16 and the pull rod is moved upward to draw a single crystal semiconductor billet 23 from the melt. As the single crystal semiconductor billet 23 is being drawn from the first melt 16 portions of the second melt 17 pass through the opening 18 into the inner crucible 14 to (1) replenish the melt use to form the crystal billet 23 and (2) maintain the dopant concentration in the first melt substantially constant by diluting the higher dopant concentration inner crucible melt 16 with the lower concentration melt 17 in the outer crucible.

Although the above process operates effectively, it has been found that there is some mechanical mixing and back diffusion from the first melt 16 in the inner crucible 14 into the second melt 17 in the outer crucible 13 via the opening 18. Such mixing and back diffusion alters the dopant concentrations of the melts 16 and 17 which ultimately adversely affects the resistivity of the grown single crystal semiconductor billet 23 resulting in a non-uniform axial resistivity of the grown billet 23.

Figure 2:
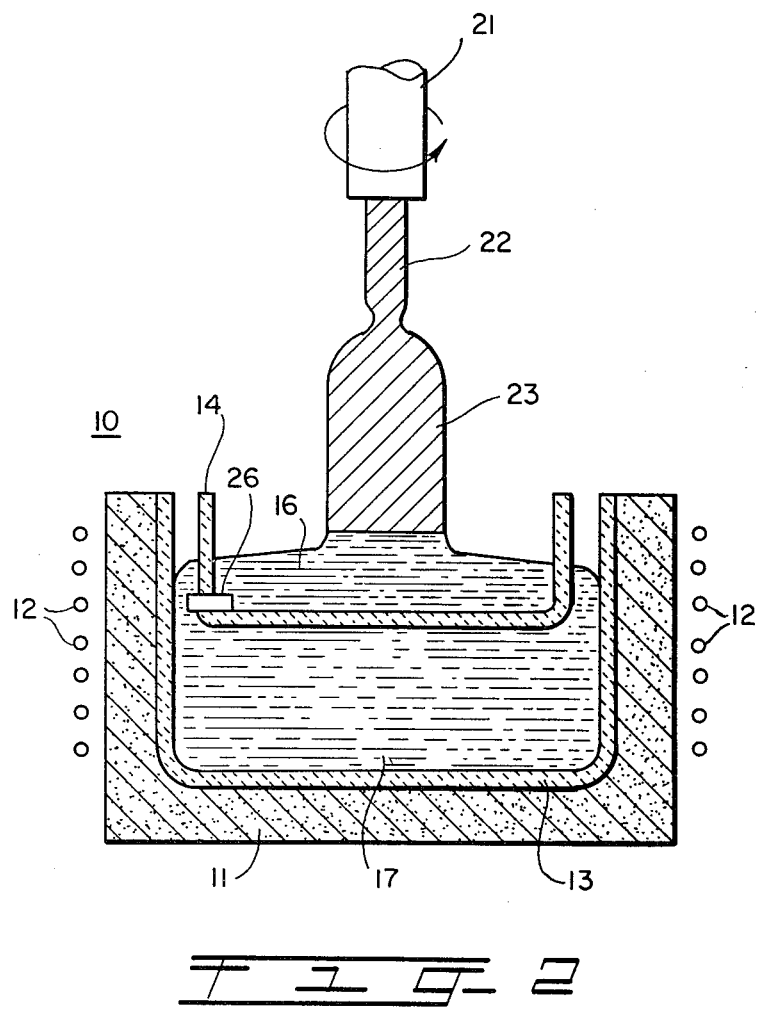
FIG. 2 is a partial cross-sectional view of a floating crucible Czochralski crystal growing apparatus in accordance with the instant invention.

FIG. 2 depicts an exemplary crystal growing apparatus 10 which has been modified to incorporate the instant inventive concepts which overcome the foregoing problem. The inner crucible 14, in particular, has been modified to insert a narrow elongated member 26 through the wall of the inner crucible to permit communication between the first and second melts 16 and 17. In the exemplary embodiment, the member 26 is a hollow quartz tube, however, other cross-sectional geometries may be used (e.g., rectangular, triangular, etc.).

As hereinbefore indicated, the first and second melts 16 and 17 are doped at different concentration levels and a concentration gradient, dc/dl, exists across the length of the tubular member 26. This gradient is inversely proportional to the length of the member 26 and directly proportional to the doping level when the concentration ratio of the two containers is fixed. At the static, or no flow, condition, dopant diffusion may be approximated as:

$$J \alpha \left( D \frac{dc}{dl} \right) \cdot A \quad (1)$$

where:
J = dopant atom transfer rate;
$A_t$ = cross-sectional area of the tube 26; and
D = diffusion coefficient of dopant in the melt.

Accordingly, the controlling factors are the dimensions of the member 26 and the doping level. A long and narrow interconnecting member 26 is preferred for diffusion suppression. A low doping level and, therefore, a low concentration gradient dc/dl results in less diffusion than in the case of high doping levels.

The average time, t, for a dopant atom to jump across the member 26 of length, l, is related to the diffusion coefficient, D, by the following equation: $t = l^2/D$. When the billet 23 is pulled from the inner crucible 14, the pressure difference between the inner crucible and the outer crucible 13 will drive the second melt 17 into the first melt 16 with a finite flow rate, $V_t$, which is opposite to the diffusion direction. The flow, therefore, aids is suppressing the back diffusion of the dopant from the first melt 16 to the second melt 17. To sufficiently suppress the dopant transfer, the criterion is:

$$V_t l >> D \quad (2)$$

The flow rate, $V_t$, is related to the crystal pull rate $V_l$, the cross sectional area, $A_s$, of billet 23; and the cross section, $A_t$, of the tube 26 as follows:

$$V_t = V_l (A_s/A_t). \quad (3)$$

Then the inequality (2) may be written as:

$$lV_l(A_s/A_t) >> D \quad (4)$$

The value of D is on the order of $10^{-4}$ cm$^2$/sec for commonly used dopants in silicon.

The more important diffusion consideration occurs when there is no flow through the member 26. This corresponds to the necking and shouldering part of the crystal growth process where no significant material is withdrawn from the inner crucible 14. A similar situation exists when crystal growth is aborted due to losing dislocation free structure, and before another billet 23 is pulled. Here diffusion control depends on a sufficiently long and narrow connecting tube 26 to minimize dopant transfer for the duration of the no-flow part of the growing process.

Figure 3A:
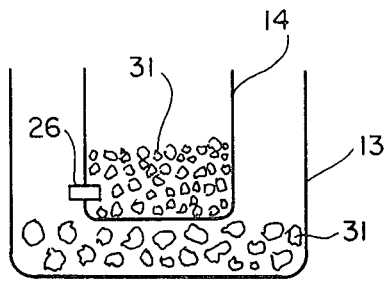
FIGS. 3A, 3B and 3C depict the melting of semiconductor nugget material in a floating crucible apparatus in schematic form.
Figure 3B:
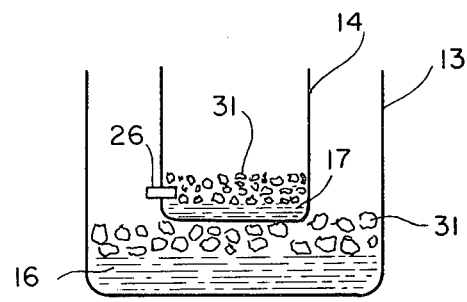
Figure 3C:
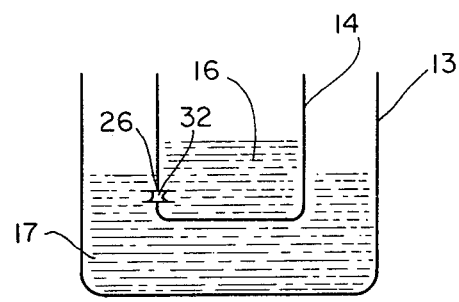

The most convenient procedure for forming the first and second melts 16 and 17 is to melt down semiconductor nuggets 31—31 as shown schematically in FIGS. 3A to 3C. The nuggets 31—31 are placed in both the inner crucible 14 and the outer crucible 13 as shown in FIG. 3A. The heating coils 12—12 (see FIG. 2) are energized and the nuggets 31—31 start to melt (FIG. 3B) until a melt has been formed in both crucibles 13 and 14 (FIG. 3C). As indicated in FIG. 3C, often, a gas bubble 32 is trapped within the tube 26 which will prevent the flow of melt between the crucibles 13 and 14 requiring that the run be aborted.

Figure 4:
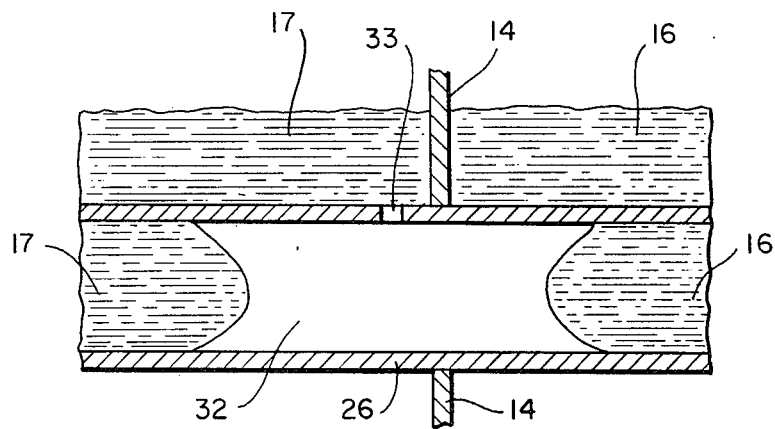
FIGS. 4 and 5 are cross-sectional views of the instant interconnecting means.
Figure 5:
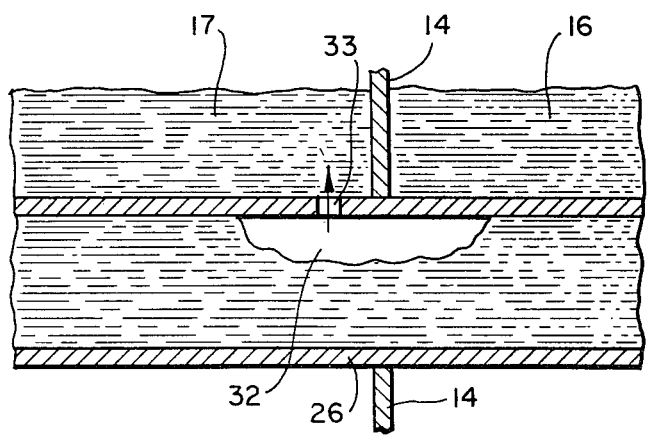

FIG. 4 is an enlarged cross section (not to scale) of the tube 26 having a gas bubble 32 formed therein. In order to eliminate the problem of trapping bubble 32, a narrow aperture 33 is placed through the wall of the member 26. As can be seen in FIG. 5, the trapped gas forming the bubble 32 will pass through the narrow aperture 33 and float to the top of the melt where it will burst. The cross-sectional area of the aperture 33 is small enough so that the surface tension of the melt will not wet or penetrate the aperture but will permit the gas to pass therethrough.

The aperture 33 may have any desired cross-sectional geometry (e.g., circular, triangular, rectangula, etc.) with the area being such that substantially no molten material will pass therethrough. The cross-sectional area of the aperture 33 will depend on the surface tension of the melt as well as the potential pressure differential that may be generated between the melts 16 and 17. In instances where the surface tension of the molten material is very low, some of the material may pass through the aperture 33. However, the amount of melt passing through such a small aperture has substantially no effect on the resistivity of the grown billet 23.

In a particular working embodiment in which the melt was silicon having a surface tension of approximately 720 dynes/cm$^2$. The member 26 was a hollow tube made of quartz and the aperture 33 in the wall of the member was substantially circular in cross section with a diameter of approximately 0.3 mm.

Preferably, the aperture 33 should be located through the top wall of the member 26 to facilitate the escape of the gas therethrough, however, if necessary, the aperture may be placed at other positions, including the bottom of the member. In addition, the number of connecting members 26 as well as the number of apertures 33 therein is not limited. A number of members 26 each having a plurality of openings have been effectively used to permit trapped gas to flow therethrough while substantially confining the melt therein.

Figure 6A:
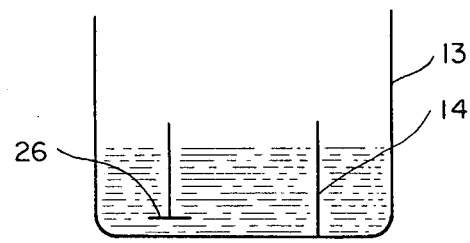
FIGS. 6A, 6B and 6C depict, in schematic form, alternative double crucible apparatus in which the instant invention can be advantageously implemented.
Figure 6B:
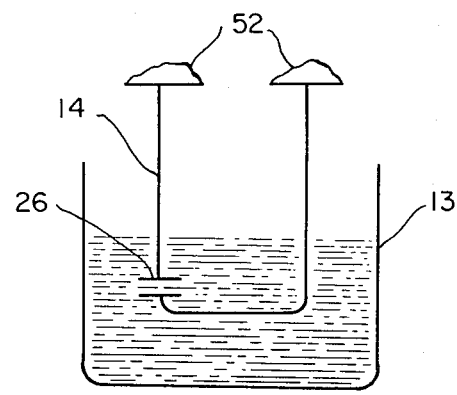
Figure 6C:
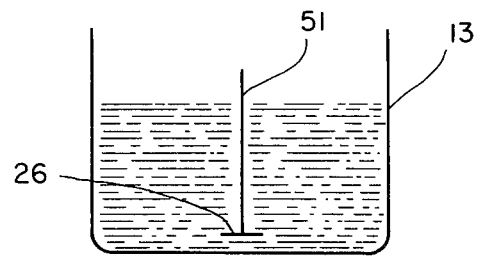

Although the instant invention has been described in relation to its use in a floating double crucible arrangement (FIG. 2), it is not so limited. The invention has application wherever there is a semiconductor material flowing through a communicating member between chambers and gas bubbles can be trapped in that member. FIGS. 6A to 6C are illustrative of, but not limited to, three different arrangements where the instant apertured connecting member 26 may be effectively used. FIG. 6A depicts a double crucible arrangement wherein the inner chamber 14 is fixedly mounted within the outer chamber 13. FIG. 6B is arranged to have the inner chamber fixedly mounted on brackets 52—52 as the outer chamber 13 is moved upward. Additionally, FIG. 6C depicts an outer chamber 13 having a dividing wall 51, each example makes use of the instant apertured interconnecting member 26.

It should be clear that the instant invention should not be limited to an apparatus comprising two chambers. An arrangement of a multiplicity of chambers, each adapted to contain a semiconductor melt and interconnected by a plurality of communicating members, is contemplated to fall within the instant concepts.

What is claimed is:

1. A method of growing a single crystal semiconductor billet from a melt in a first crucible, which melt is replenished by a melt in a second crucible via an elongated communicating channel of such a length as to inhibit back diffusion of the melt therethrough, the method is characterized by:
   permitting any gas in the channel to pass through at least one small aperture in the channel wall into the first and/or second crucibles; while
   substantially precluding the flow of the melt through said aperture.

2. The method as set forth in claim 1, wherein:
   the semiconductor melt is silicon, and the elongated communication channel is a quartz tube with the small aperture in the wall thereof having a diameter of approximately 0.3 mm.

3. The method as set forth in claims 1 or 2, wherein the melt in the first crucible is replenished by the melt in the second crucible via a plurality of elongated communicating channels, each channel having at least one small aperture in the wall thereof.

* * * * *

UNITED STATES PATENT AND TRADEMARK OFFICE
CERTIFICATE OF CORRECTION

PATENT NO. : 4,246,064
DATED : January 20, 1981
INVENTOR(S) : T. J. Dewees, J. S. Fangman, W. Lin It is certified that error appears in the above—identified patent and that said Letters Patent is hereby corrected as shown below:

In the specification, Column 1, line 63, "higly" should be --highly--. Column 3, line 62, "dc/dl" should be --dc/dℓ'--. Column 4, Equation (1), "$J \alpha \left( D \frac{dc}{dl} \right) . A$" should be --$J \alpha \left( D \frac{dc}{d\ell} \right) . A$--.

Column 4, line 10, "Accordingly ," should be --Accordingly,--. Column 4, line 14, "dc/dl" should be --dc/dℓ--. Column 4, line 17, "l" should be --ℓ--. Column 4, line 18, "$t=l^2/D$" should be --$t=\ell^2/D$--. Column 4, Equation (2), "$V_t l >> D$" should be --$V_t \ell >> D$--. Column 4, Equation (4), "$1V_1(A_s/A_t >> D$" should be --$\ell V_1 (A_s/A_t) >> D$--. Column 5, line 8, "The aperture 33..." should not start a new paragraph. Column 5, line 9, "rectangula" should be --rectangular--.

Signed and Sealed this

Fifth Day of May 1981

[SEAL]

Attest:

RENE D. TEGTMEYER

*Attesting Officer*     *Acting Commissioner of Patents and Trademarks*